Aug. 30, 1960 V. F. DAHLGREN 2,951,112

PRINTED CIRCUIT COMPONENT

Filed Dec. 30, 1957

2 Sheets-Sheet 1

Victor F. Dahlgren
INVENTOR

Aug. 30, 1960 V. F. DAHLGREN 2,951,112

PRINTED CIRCUIT COMPONENT

Filed Dec. 30, 1957 2 Sheets-Sheet 2

Victor F. Dahlgren
*INVENTOR*

United States Patent Office 2,951,112
Patented Aug. 30, 1960

2,951,112

PRINTED CIRCUIT COMPONENT

Victor F. Dahlgren, Windham, N.H., assignor to Sanders Associates, Inc., Nashua, N.H., a corporation of Delaware Filed Dec. 30, 1957, Ser. No. 706,051
8 Claims. (Cl. 174—135)

The present invention relates to insulated electrically conductive articles and, particularly, to printed circuit type articles utilizing metallic conductors bonded to a wide range of plastic materials. More especially, the invention relates to printed circuit cables and terminations therefor.

Printed circuit articles have been developed providing the equivalent of the conventional multi-conductor cables. The printed circuit type of cable assumes the form of a flat, relatively thin sheet of plastic material having flat, thin conductors all in the same plane or at most in a few superimposed planes. In one form of such a cable, the conductors are of uniform width and separated by a uniform distance.

The present invention is directed to an improvement in such printed circuits by providing a solution for the problems arising from breakage due to flexure of the cable and strain at terminal connections. In the past, connections to the terminals of flexible, printed circuit cables have been made by soldering an exposed tip of a conductor within the cable to a pin on some exterior device. A connection of this type, however, becomes wholly inadequate when there is much flexure of the cable immediately adjacent the terminal connection. The electrical connection is subject to breakage by severe and repeated flexure, and the plastic insulation tends to crack open.

It is therefore an object of the present invention to provide an improved structure for flexible, printed circuit cable ends.

It is a further object of the present invention to provide an improved flexible, printed circuit article having a simplified reinforcing arrangement for terminal connections.

Yet another object of this invention is to provide an improved printed circuit cable having limited flexure immediately adjacent terminal connections.

In accordance with the present invention, there is provided a flat, flexible, printed circuit cable having one end adapted to be relatively fixed in position. Integrally formed with and extending from this fixed end of the cable is a substantially rigid accessory. Disposed in the vicinity of the fixed end of the cable is a terminal connected to a cable conductor. The rigid accessory is so formed toward the opposite end of the cable as to provide a fixture with an edge disposed on the opposite side of the terminal relative to the fixed end and being transverse to the longitudinal axis of the cable. An axis is thereby provided, spaced from the terminals, about which the cable may be flexed without producing an excessive strain at the terminal.

As used herein, the term "plastic" includes a synthetic organic material of high molecular weight, and which, while solid in the finished state, at some stage in its manufacture is soft enough to be formed into shape by some degree of flow. The well-known term "Kel-F" as used herein is the trademark of The M. W. Kellogg Company and refers to the plastic polymer tri-fluoro-chloroethylene as manufactured by them. The well-known term "Teflon" as used herein is the trademark of the E. I. duPont de Nemours & Company, Inc. and refers to the plastic polymer tetra-fluoro-ethylene manufactured by them. The term "ethylene" includes all those plastic materials containing an ethylene radical and the term "vinyl" includes all those plastic materials containing a vinyl radical. The term "Saran," trademark of the Dow Chemical Company, is used herein to denote those plastic materials containing a vinylidine radical. The term "nylon" as used herein refers generically to the group of plastic materials known as polyamides.

For a better understanding of the present invention, together with other and further objects thereof, reference is made to the following description taken in connection with the accompanying drawings and its scope will be pointed out in the appended claims.

DETAILED DESCRIPTION OF THE INVENTION

Figures 1, 2:
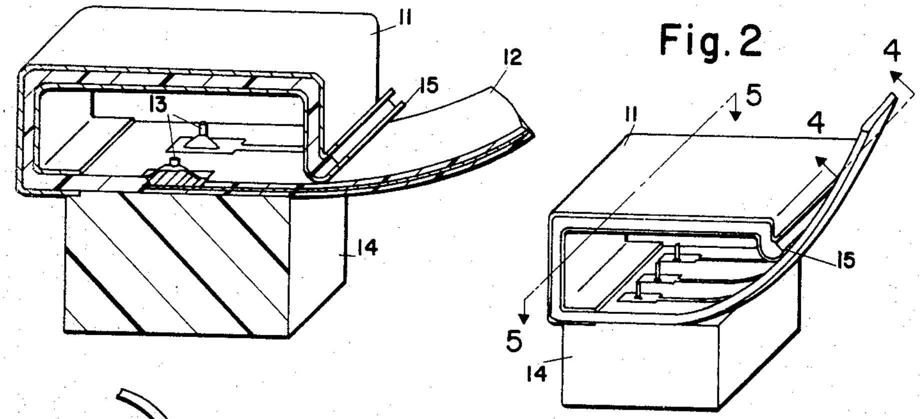
Fig. 1 is a perspective view partly in section of one structural embodiment of the present invention.
Fig. 2 is a perspective view of an embodiment similar to that of Fig. 1.

Referring now to the drawings and with particular reference to Fig. 1, there is shown the accessory 11 of this invention including a printed circuit cable 12 having terminals 13 connected to a terminal block 14. Typically, the cable 12 is relatively fixed at one end, in this instance to terminal block 14. The block 14 merely represents a conventional connector or receptacle mounted in place on a suitable electrical apparatus. The accessory 11 is made as an integral part of cable 12 and is formed from a substantially rigid material. It may be made of molded plastic or, for convenience, it may be made from the same materials as the printed circuit cable 12. For example, if the printed circuit cable 12 has 1 mil copper conductors laminated between layers of poly-tri-fluoro-chloro-ethylene, the accessory 11 may be made by the lamination of 1 to 3 mil sheets of copper to the poly-tri-fluoro-chloro-ethylene coating at the cable end. An advantage of the laminated accessory structure is that it is stronger for a given thickness. The stiffness of the accessory 11 will, of course, be governed by the thickness of the material forming the accessory. The requirements for this stiffness will in turn be determined by the thickness of the cable used.

Figure 3:
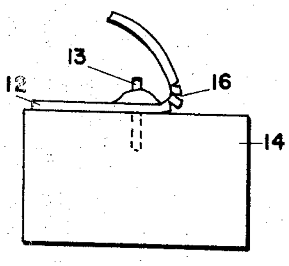
Fig. 3 is side view of a conventional printed circuit cable and terminal connection illustrating flexure of the cable about the terminal.

The accessory 11 is shown extending beyond the terminals 13 and is so formed back toward the opposite end of cable 12 as to provide a fixture with an edge 15 transverse to the longitudinal axis of cable 12. A minimum bending radius is thus provided for the cable when it is flexed about the terminal block 14 and terminals 13. The contour of accessory 11 may take many forms to limit the bending radius of the cable adjacent terminals 13 and relieve the strain on these terminals. For example, the accessory 11 may be formed in the arc of a circle or it may be formed back under the terminal block 14 and slotted to provide a rigid edge laterally across the top of the cable 12 when the cable is threaded through the slot. The edge 15 may rest securely on the cable 12 or it may be positioned above the cable 12 as more particularly illustrated in Fig. 2. However, an advantage of having the edge 15 in contact with the cable 12 is that by securing the cable 12 between the edge 15 and the terminal block 14, greater strain relief is afforded the terminals 13. Fig. 3 more particularly illustrates how a conventional terminal connection may break down. Here there is shown a typical terminal connection 13 of a flexible printed circuit cable 12 to a terminal block 14. After flexing about the terminal 13, the connection tends to weaken and cracks 16 tend to develop in the plastic insulation. The accessories of the present invention obviously avoid this difficulty by the means pointed out above.

Figure 4:
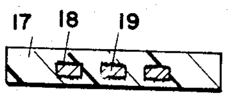
Fig. 4 is a cross-section taken along the line 4—4 of Fig. 2.
Figure 5:
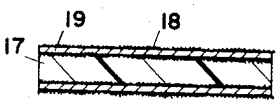
Fig. 5 is a cross-section taken along the line 5—5 of Fig. 2.

While applicant does not intend to be limited to any particular materials in the manufacture of the article of this invention, the combination of copper and poly-tri-fluoro-chloro-ethylene has been found to be particularly useful. For example, the printed circuit cable may be made from 1 ounce copper conductors having an adherent coating of black cupric oxide formed by oxidation in a chemical bath. These conductors are then readily laminated between 2 mil sheets of poly-tri-fluoro-chloro-ethylene. The accessories may likewise be made by laminating sheets of 3 ounce copper, having an adherent coating of black cupric oxide formed by oxidation in a chemical bath, to the outer surface of the cable. Figs. 4 and 5 particularly illustrate the laminate structure showing in cross section the plastic 17, the cupric oxide coating 18, and the copper 19.

Figure 6:
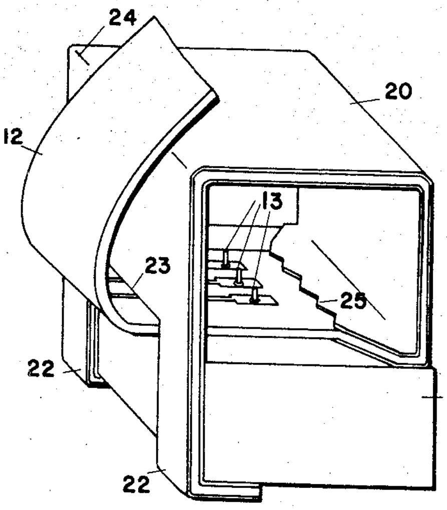
Fig. 6 is a perspective view of another structural embodiment of the present invention.
Figure 7:
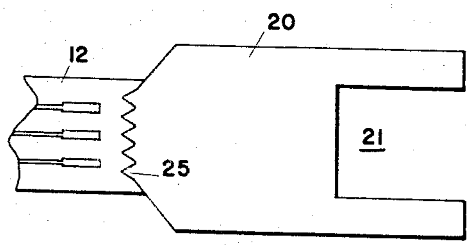
Fig. 7 is a plan view of the embodiment of Fig. 6.

Another embodiment of the present invention that has been found to be particularly useful is illustrated in Figs. 6 and 7. In this embodiment the accessory 20 is wider than the cable 12. The free end of the accessory 20 has a slot 21 therein equal in width to the body of cable 12. After the connection is made to terminals 13, the accessory 20 is formed back toward the opposite end of the cable 12 and slot 21 is made to engage the cable 12 as illustrated more particularly in Fig. 6. The accessory ends 22 are clinched around the terminal block 14 to add strength to the whole assembly by securing the edge 23 from movement when the cable 12 is flexed. The bottom of slot 21 then provides the edge 23 which is transverse to the longitudinal axis of the cable 12. This limits the bending radius when cable 12 is flexed about the terminal block 14 and terminals 13 and thereby relieves the strain on the terminals 13. This bending radius is further limited as the cable 12 contacts the upper edge 24 of the accessory 20. The edge 25 at the origin of accessory 20 is pinked so that it does not form a sharp line along which the plastic insulation may crack. Other configurations obvious to those skilled in the art may be used to perform the same function as the pinked edge 25.

To illustrate more completely the types of materials that may be used to manufacture the article of this invention, there follows several examples of methods of bonding copper to plastic materials.

*Tri-fluoro-chloro-ethylene—copper article*

Figure 8:
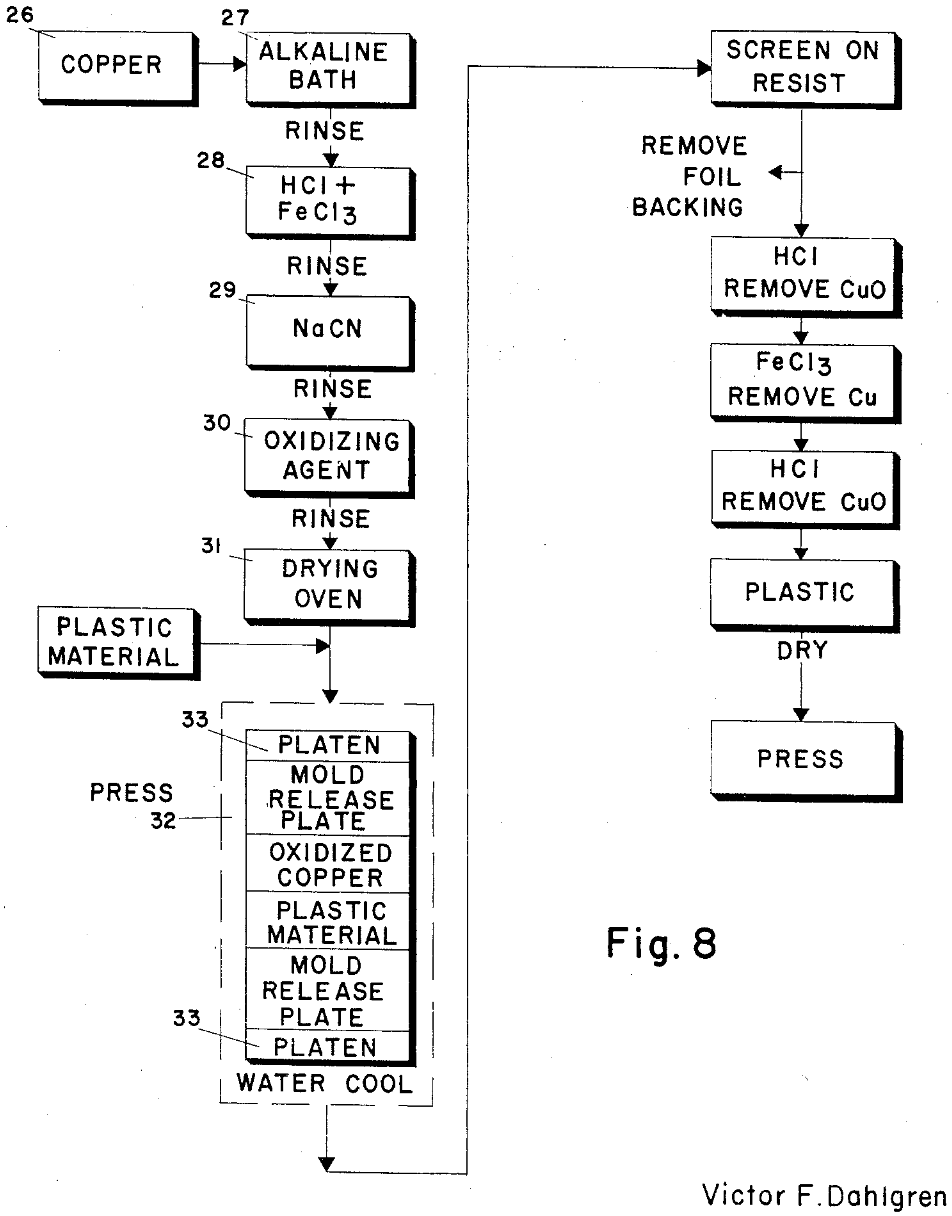
Fig. 8 is a flow chart illustrating the preferred process for manufacturing printed circuit articles in accordance with the present invention.

Referring now to Figure 8 of the drawings, a flow chart for a method of manufacturing a tri-fluoro-chloro-ethylene—copper article is illustrated. The method is carried out in detail in the following manner:

Sheets of copper 26 are:

(1) Immersed in a mild alkaline bath 27, such as Dy-Clene EW Metal Cleaner, as manufactured by MacDermid, Inc., of Waterbury, Connecticut, for five seconds;

(2) Rinsed in cold, running water for five seconds;

(3) Dipped for 15 seconds in a 10 percent solution of hydrochloric acid (HCl) 28 containing a small amount of ferric chloride ($FeCl_3$);

(4) Rinsed in cold, running water for five seconds;

(5) Immersed in a 10 percent solution 29 of sodium cyanide (NaCN) for 15 seconds and then rinsed;

(6) Immersed for 10 minutes at 190° F.–210° F. in an oxidizing agent 30, such as an aqueous solution of 1 and ½ pounds of Ebonol "C" Special, as manufactured by Enthone Company, New Haven, Connecticut, per gallon of water. The oxidizing agent is preferably a hot aqueous solution consisting essentially of an alkali selected from the group consisting of sodium hydroxide and potassium hydroxide and a chlorite selected from the group consisting of sodium chlorite and potassium chlorite.

(7) Immersed in cold, running water;

(8) Rinsed in hot, running water for 10 to 20 seconds; and (9) Baked in a preheated oven 31 at a temperature above 212° F. until all traces of moisture are removed.

These steps result in providing a sheet of copper having a cupric oxide surface obtained by utilizing a chemical agent rather than by applying heat as in the prior art. The cupric oxide obtained in the manner described in steps 1 to 9 above is quite different from that obtained by heating. It appears as a homogeneous, velvety black coating. The black is intense. Under a microscope of greater than 300 power, the crystals of oxide appear fine and needlelike and in a much thinner layer than that obtained when copper is heated. Further, and probably most important, this cupric oxide differs from that obtained by heating in that it is tightly bonded to the copper and will not flake off.

The copper sheets obtained by means of steps 1 to 9 above are now ready for lamination to a plastic. The lamination process is, for example, as follows:

(10) Place a sheet of thin, metallic-foil mold release plate, such as aluminum, on the platen of a press 32, such as manufactured by Wabash Press Company, Wabash, Indiana; the aluminum foil is used to prevent adherences between the tri-fluoro-chloro-ethylene and the platen;

(11) Place a lamination of a sheet of plastic material on the platen 33 of the press 32. This lamination may have as many layers as desired, for reasons to be considered more fully hereinafter. The plastic may be, for example, tri-fluoro-chloro-ethylene and each sheet may be, for example, 6 inches long, 2 inches wide and 2 mils thick. The temperature of the oven is, for example, 400° C.

(12) Place a sheet of copper, coated in accordance with steps 1 to 9 on top of a tri-fluoro-chloro-ethylene layer of the laminate and apply an initial pressure of approximately 5 pounds per square inch, gradually increasing the pressure;

(13) Bake under pressure at 216° C. to 219° C. for 40 seconds;

(14) Remove the copper clad plastic from the press and quench in cold water; and

(15) Remove the aluminum foil.

This process provides a copper-clad plastic article which may be used for any of a number of purposes. Though definite pressures and temperatures are mentioned above, the pressures, times and temperatures are interrelated and vary also with the thickness, area and type of plastic material used. Generally, the temperature is in the range of 215° C. to 300° C. and the initial pressure is of the order of 5 pounds per square inch but building up to higher pressures which may be of the order of hundreds of pounds per square inch. The parameters are time-temperature, primarily and, to some degree, time and temperature, in terms of the pressure applied, may be interchanged.

The plastic can, of course, be copper clad on both sides, as in the illustrated embodiments of this invention, merely by placing sheets of copper both above and below the plastic cable extension. Similarly, a number of sheets of plastic may be intermixed with cupric oxide coated sheets of copper to form a laminated structure.

Another method for effecting the bond involves the use of a rotary press. The rollers are heated to a temperature of 215° C. to 250° C. and thermostatically maintained. The copper-plastic bond is effected by covering a sheet of plastic, such as tri-fluoro-chloro-ethylene with two sheets of cupric oxide coated copper and introducing the composite article between the rollers. Preferably, the rollers are spaced so as to apply a positive pressure greater than 5 pounds per square inch, and are rotated at such a rate as to provide a linear speed of, for example, 10 inches per minute, to the sheets.

A modified form of the improved method of bonding tri-fluoro-chloro-ethylene to copper involves the use of powdered tri-fluoro-chloro-ethylene which is spread on top of a sheet of cupric oxide covered copper. For unplasticized powder of high molecular weight, the operating temperature range may be as high as 300° C. After placing the powder in contact with the copper (and, if desired, applying another sheet of copper on top of the powder), the press is closed at the rate of 0.2 inch per minute until the desired thickness is obtained as determined by gauge blocks. By shining a light through the material, a color change will be observed from pink to white. After the white light appears, the press is held in place for 15 to 30 seconds, depending upon the thickness of the material desired. The composite sheet thus obtained is then quenched in cold water or transferred to a cold press. In both processes immediate quenching produces crystallization and thus a relatively high degree of transparency. The other layers of plastic can be added as desired.

The bond strengths obtained as measured by delaminating a one inch strip of copper from the tri-fluoro-chloro-ethylene are consistently greater than 8 pounds per inch. Bond strengths of 18 pounds per inch and higher are obtainable. For example, laminates prepared by starting with the tri-fluoro-chloro-ethylene powder as indicated above are characterized by bond strengths which are consistently in excess of 15 pounds per inch.

To manufacture a component of an electric circuit, the copper of the article prepared in the manner described above may be treated as indicated in the remainder of the flow chart of Fig. 1. A resist is placed on the copper in the pattern of a desired configuration and the excess removed by a suitable etching technique. The remaining resist is removed and the circuit may then be encapsulated by placing a sheet of plastic in contact with the coated copper and sealing by means of pressure in the manner described above.

*Tetra-fluoro-ethylene—copper article*

Using the same apparatus and general procedure as outlined in Fig. 8, and differing only in the plastic to copper bonding process, a thin sheet of Teflon, for example under .010 inch thick, is placed in contact with a sheet of cupric oxide coated copper foil, for example 2 ounce copper, and placed in the press 32. The plastic-copper laminate is preheated at approximately 700° F. for several minutes and then pressed at that temperature and in the order of 250 pounds per square inch pressure for about 6 minutes. The laminate is then water cooled in the press under continued pressure. Bond strengths have been observed as high as 8 pounds per inch.

A number of compounds which typify large classes of plastic materials have been laminated to cupric oxide coated copper in the manner suggested above. The temperature, pressure, preheat time under slight pressure, heating time under pressure, the thickness of copper used, the thickness of the plastic and the resultant peel strengths are tabulated below for a number of materials utilized.

PARAMETERS FOR BONDING COPPER TO PLASTIC

| | Temp. of Materials (° C.) | Pressure (Lbs./In.) | Time of Preheat (Minutes) | Minimum Time in Press (Minutes) | Thickness of Copper ($10^{-3}$ In.) | Thickness of Plastic ($10^{-3}$ In.) | Peel Strength (Grams/In.) |
|---|---|---|---|---|---|---|---|
| Ethylenes: | | | | | | | |
| Polyethylene | 127 | 70–80 | 1 | 4 | 1.35 | ---------- | >3,000, tearing of polyethylene |
| Kel-F | 234 | 120–150 | 5 | 6 | 1.35 | 10 | 4,200 |
| Teflon [1] | 380 | 120–150 | 5 | 6 | 2.70 | 10 | 1,650 |
| Vinyls: | | | | | | | |
| Polyvinyl Chloride | 220 | 120–150 | 1 | 4 | 1.35 | 10 | 3,100 |
| Polyvinyl Butyral | 193 | 120–150 | 1 | 4 | 2.70 | 8.5 | 3,300 |
| Polyvinyl Acetate | 200 | 120–150 | 1 | 4 | 2.70 | 10 | 3,100 |
| Polyvinyl Alcohol [1] | 205 | 325–350 | 1 | 4 | 2.70 | 11 | 5,500 |
| Saran: | | | | | | | |
| Polyvinylidene Chloride | 180 | 120–150 | 1 | 4 | 2.70 | 12 | (2) |
| Polyvinylidene Styrene | 205 | 120–150 | 5 | 6 | 2.70 | 31 | 2,500 |
| Polyamides: Nylon NC-10 [1] | 250 | 325–350 | 5 | 6 | 1.35 | Crystals | 4,000 |
| Cellulosics: Cellulose Acetate [1] | 193 | 120–150 | 1 | 4 | 2.70 | 30 | 7,260 |
| Acrylics: Methyl Methacrylate [1] (Plexiglas) | 250 | 325–350 | 5 | 6 | 2.70 | 66 | 2,000 |
| Rubber Hydroxide [1] | 122 | 120–150 | 1 | 4 | 1.35 | 9 | Decomposes |

[1] Press—water cooled.
[2] Turned brown—tearing of material at 1,500 grams.

The plastic-copper bonding mechanism is not thoroughly understood. However, as a result of much experimentation and analysis, it is believed that the bonding mechanism is essentially mechanical. One basic requirement seems to be that the plastic material must flow fairly readily without decomposing. As indicated in the previous table, some of the materials tend to decompose before the desired melt-viscosity is reached even though a satisfactory bond may still be obtained. In the case of some forms of Teflon the degree of plasticity increases with temperature, but the material tends to decompose before it reaches a suitable flow point. It will be apparent, however, that while a degree of flow is necessary to cause the plastic material to fill the interstices formed by cupric oxide needles, more or less randomly oriented, a good bond is obtainable even though ideal flow conditions are not realized. In the case of the polyvinyl material it has been frequently observed that the bond is stronger than the plastic material itself. Thus, for polyvinyl chloride and polyvinyl acetate the peel strength is indicated on the order of 3000 grams. This is the pulling force at which the plastic material broke.

While there has been described what is at present considered to be the preferred embodiment of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A printed circuit component, comprising: a flat, flexible, printed circuit cable having a conductor embedded therein and one end adapted to be relatively fixed in position; a substantially rigid accessory integrally formed with and extending from said fixed end of said cable; and a terminal connected to a cable conductor and disposed in the vicinity of said fixed end, said accessory being so formed toward the opposite end of said cable as to provide a fixture with an edge disposed on the opposite side of said terminals relative to said fixed end and being transverse to the longitudinal axis of said cable to provide, thereby, an axis, spaced from said terminal, about which said cable may be flexed without producing an excessive strain at said terminal.

2. A printed circuit component, comprising: a flat, flexible, printed circuit cable having a metallic foil conductor embedded therein and one end adapted to be relatively fixed in position; a substantially rigid accessory extending from said fixed end of said cable, said accessory comprising a sheet of metal laminated to a plastic extension integrally formed with said cable end; and a terminal connected to a cable conductor and disposed in the vicinity of said fixed end, said accessory being so formed toward the opposite end of said cable as to provide a fixture with an edge disposed on the opposite side of said terminals relative to said fixed end and being transverse to the longitudinal axis of said cable to provide, thereby, an axis, spaced from said terminal, about which said cable may be flexed without producing an excessive strain at said terminal.

3. A printed circuit component, comprising: a flat, flexible, plastic printed circuit cable having a copper foil conductor embedded therein and one end adapted to be relatively fixed in position; a substantially rigid accessory extending from said fixed end of said cable, said accessory comprising a sheet of copper laminated to a plastic extension integrally formed with said cable end; and a terminal connected to a cable conductor and disposed in the vicinity of said fixed end, said accessory being so formed toward the opposite end of said cable as to provide a fixture with an edge disposed on the opposite side of said terminals relative to said fixed end and being transverse to the longitudinal axis of said cable to provide, thereby, an axis, spaced from said terminal, about which said cable may be flexed without producing an excessive strain at said terminal.

4. A printed circuit component, comprising: a flat, flexible, plastic printed circuit cable having embedded therein a copper foil conductor coated with black cupric oxide produced by oxidation in a chemical bath, one end of said cable adapted to be relatively fixed in position; a substantially rigid accessory extending from said fixed end of said cable, said accessory comprising a sheet of cupric oxide coated copper laminated to a plastic extension integrally formed with said cable end; and a terminal connected to a cable conductor and disposed in the vicinity of said fixed end, said accessory being so formed toward the opposite end of said cable as to provide a fixture with an edge disposed on the opposite side of said terminals relative to said fixed end and being transverse to the longitudinal axis of said cable to provide, thereby, an axis, spaced from said terminal, about which said cable may be flexed without producing an excessive strain at said terminal.

5. A printed circuit component, comprising: a flat, flexible, printed circuit cable having a conductor embedded therein and one end adapted to be relatively fixed in position; a substantially rigid accessory, wider than said cable, integrally formed with and extending from said fixed end of said cable, said accessory having a slot in the free end thereof equal in width to said cable; and a terminal connected to a cable conductor and disposed in the vicinity of said fixed end, said accessory being so formed toward the opposite end of said cable that said slot will engage said cable and supply a fixture with an edge disposed on the opposite side of said terminals relative to said fixed end and being transverse to the longitudinal axis of said cable, thereby providing an axis, spaced from said terminal, about which said cable may be flexed without producing an excessive strain at said terminal.

6. A printed circuit component, comprising: a flat, flexible, printed circuit cable having a metallic foil conductor embedded therein and one end adapted to be relatively fixed in position; a substantially rigid accessory, wider than said cable and having a slot in the free end thereof equal in width to said cable, extending from said fixed end of said cable, said accessory comprising a sheet of metal laminated to a plastic extension integrally formed with said cable end; and a terminal connected to a cable conductor and disposed in the vicinity of said fixed end, said accessory being so formed toward the opposite end of said cable that said slot will engage said cable and supply a fixture with an edge disposed on the opposite side of said terminals relative to said fixed end and being transverse to the longitudinal axis of said cable, thereby providing an axis, spaced from said terminal, about which said cable may be flexed without producing an excessive strain at said terminal.

7. A printed circuit component, comprising: a flat, flexible, printed circuit cable having embedded therein a copper foil conductor and one end adapted to be relatively fixed in position; a substantially rigid accessory, wider than said cable and having a slot in the free end thereof equal in width to said cable, extending from said fixed end of said cable, said accessory comprising a sheet of copper laminated to a plastic extension integrally formed with said cable end; and a terminal connected to a cable conductor and disposed in the vicinity of said fixed end, said accessory being so formed toward the opposite end of said cable that said slot will engage said cable and supply a fixture with an edge disposed on the opposite side of said terminals relative to said fixed end and being transverse to the longitudinal axis of said cable, thereby providing an axis, spaced from said terminal, about which said cable may be flexed without producing an excessive strain at said terminal.

8. A printed circuit component, comprising: a flat, flexible, printed circuit cable having embedded therein a copper foil conductor coated with black cupric oxide produced by oxidation in a chemical bath and one end adapted to be relatively fixed in position; a substantially rigid accessory, wider than said cable and having a slot in the free end thereof equal in width to said cable, extending from said fixed end of said cable, said accessory comprising a sheet of cupric oxide coated copper laminated to a plastic extension integrally formed with said cable end; and a terminal connected to a cable conductor and disposed in the vicinity of said fixed end, said accessory being so formed toward the opposite end of said cable that said slot will engage said cable and supply a fixture with an edge disposed on the opposite side of said terminals relative to said fixed end and being transverse to the longitudinal axis of said cable, thereby providing an axis, spaced from said terminal, about which said cable may be flexed without producing an excessive strain at said terminal.

UNITED STATES PATENTS

References Cited in the file of this patent

| | | |
|---|---|---|
| 1,637,059 | Simmonds | July 26, 1927 |
| 2,425,408 | Williams et al. | Aug. 12, 1947 |

OTHER REFERENCES

Publication: Electrical Manufacturing, pp. 126, 127, November 1956.